US009506951B2

(12) United States Patent
Taratorin et al.

(10) Patent No.: US 9,506,951 B2
(45) Date of Patent: Nov. 29, 2016

(54) METHOD AND APPARATUS FOR DATA ACQUISITION WITH WAVEFORM TRIGGER

(71) Applicant: Guzik Technical Enterprises, Mountain View, CA (US)

(72) Inventors: Alexander Taratorin, Palo Alto, CA (US); Anatoli B. Stein, Atherton, CA (US); Lauri Viitas, Palo Alto, CA (US); Igor Tarnikov, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 14/992,373

(22) Filed: Jan. 11, 2016

(65) Prior Publication Data

US 2016/0231357 A1    Aug. 11, 2016

Related U.S. Application Data

(60) Provisional application No. 62/107,869, filed on Jan. 26, 2015.

(51) Int. Cl.
*G01R 13/00* (2006.01)
*G01R 13/02* (2006.01)

(52) U.S. Cl.
CPC ......... *G01R 13/0254* (2013.01); *G01R 13/029* (2013.01)

(58) Field of Classification Search
CPC ............. H02M 3/33507; H04N 17/00; G11B 20/1419; G11B 20/1426
See application file for complete search history.

(56) References Cited

U.S. PATENT DOCUMENTS

| 2,817,043 | A | * | 12/1957 | Stein | H04N 17/00 315/405 |
| 4,641,246 | A | * | 2/1987 | Halbert | G01R 31/2834 324/121 R |
| 4,797,936 | A | | 1/1989 | Nakatsugawa et al. | |
| 4,843,309 | A | | 6/1989 | Kareem et al. | |
| 5,387,925 | A | * | 2/1995 | Melling, Jr. | H04N 17/00 345/157 |
| 6,621,913 | B1 | | 9/2003 | de Vries | |
| 7,616,459 | B2 | * | 11/2009 | Huynh | H02M 3/33507 363/21.12 |
| 2014/0108856 | A1 | | 4/2014 | Salle et al. | |

* cited by examiner

*Primary Examiner* — Elias Desta
(74) *Attorney, Agent, or Firm* — Burns & Levinson LLP; Joseph M. Maraia

(57) ABSTRACT

Digital signal acquisition system is triggered when an input waveform matches a known reference waveform. This is achieved by calculating a stream of error metric values defined as a sum of absolute values of differences between incoming and reference samples. An error metric is calculated using only byte operations, which is advantageous for hardware implementation. A waveform trigger is determined by a sample index corresponding to a minimum value of the error metric and corresponds to a best match between input and reference waveforms. A waveform trigger is used for synchronous averaging and estimating time domain noise voltage. A reference waveform updates in poor SNR conditions to provide robust estimates of time domain noise by reducing reference waveform jitter.

33 Claims, 6 Drawing Sheets

METHOD AND APPARATUS FOR DATA ACQUISITION WITH WAVEFORM TRIGGER

CROSS-REFERENCED TO RELATED APPLICATIONS

This application claims the benefit of U.S. Provisional Application Ser. No. 62/107,869, filed on Jan. 26, 2015, the disclosure of which is incorporated herein by reference in its entirety.

TECHNICAL FIELD

The present disclosure relates generally to signal processing and more particularly to systems and methods for waveform-based trigger detection.

BACKGROUND

Real-time signal digitizers and digital oscilloscopes can operate in different modes. In a "free-running", or a non-triggered mode, a stream of incoming signal samples is stored in memory, or on disk, for subsequent analysis and processing. In a triggered mode, a special trigger signal is required to synchronize acquisition with the trigger signal. The trigger signal can come from external source (external trigger), or can be generated based on specific signal properties. A common example is an "edge trigger", generated by detecting a signal crossing specified voltage level. Both analog and digital trigger techniques are widely used. Digital triggers have well known advantages, such as reduced jitter level. A real-time digital trigger method is described in U.S. Patent Application Publication No. 2014/0047198. In that application, a digital trigger is generated by a dedicated trigger channel. This channel operates in real time and stores trigger events in a trigger memory. A controller reads out stored data values from a data acquisition memory based on real-time trigger events read from the trigger memory.

U.S. Pat. No. 6,753,677 describes systems for trigger jitter reduction for real time digital oscilloscopes. The triggering methods discussed in that patent are not signal-dependent, but are based on standard methods, such as edge (threshold)-based methods and time delay (hold-off)-based methods. In particular, trigger jitter reduction is based on adjustment of a trigger voltage by analyzing recorded waveforms, followed by an adjustment of the trigger voltage and digital sample interpolation.

The complexity of waveforms is increasing with the advancement of digital communication technologies, high speed transmission links and electronics. Common triggering methods are based on voltage level thresholds and timing delays. These methods are not sufficient for reliable detection and analysis of complicated signal waveforms, such as for example, long pseudo-random sequences distorted by communication channels and noise, or high frequency RF pulses used in radar technology.

The need for advanced signal triggering has been realized since digital oscilloscopes were developed. However, limited waveform memory and digital signal processing capabilities have prevented efficient implementation of complicated signal triggers.

Currently high-end digital oscilloscopes offer advanced triggering options, such as "zone triggering" (see Agilent application note "Keysight Technologies Triggering on Infrequent Anomalies and Complex Signals using Zone Trigger" www.keysight.com), or "Visual triggering" by Tektronix (www.tek.com). These approaches are based on manual selection of specific signal events (e.g., extra pulses or missing pulses inside specified timing intervals), defining well-defined logical sequences of events (e.g., a first timing interval between negative and positive edges exceeding a threshold value, with a next timing interval being smaller than the threshold), and subsequent triggering on detection of those events. However those triggering options are limited to well-defined and simple events, and are not universal.

The prior art describes a number of approaches for waveform-based trigger detection.

U.S. Pat. No. 4,797,936 describes a waveform sequence trigger system based on comparing incoming a digitized signal with a binary sequence generated by an analog comparator set to a specific signal level. A reference signal is converted by a comparator and shift registers to a sequence of logical states, e.g., "1" being assigned to a reference signal being above a threshold and "0" being assigned to a reference signal being below the threshold. Then, an incoming sequence of signal samples is compared to a binary reference sequence and a signal indicative of coincidence generates a trigger event. This method is relatively simple; however it is not flexible enough and based on a dedicated hardware circuit comprising a sequence of analog comparators and shift registers.

U.S. Pat. No. 4,843,309 describes a method and apparatus for correction of timing misalignment between waveforms acquired by digital oscilloscopes using a cross-correlation function. In that patent, repetitive signal waveforms are aligned by calculating a signal cross-correlation function, estimating a waveform timing shift by finding a value of the cross-correlation function exceeding preselected tolerance and aligning the waveforms based on the estimated timing shift. The method of cross-correlation for signal alignment is a standard approach used in signal processing and communication theory. However, direct calculation of cross-correlation requires a significant amount of calculations. For example, real-time alignment of a 500 ns signal waveform acquired with a 20 GS/s sampling rate, requires at least 10 thousand multiplications for each signal sample, which transforms to over 1014 operations per second.

U.S. Pat. No. 6,621,913 describes a digital oscilloscope with trigger qualification based on pattern recognition. A digitized signal is stored in a waveform memory, and a trigger circuit having two comparators, each of which is set to a distinct voltage level. A pattern detection circuit is based on detecting a change of an incoming signal state, e.g., a signal crossing a first level and then a second level, or vice versa, and/or detecting time intervals between such level crossings. When the sequence of detection events coincides with a reference sequence, a trigger signal is generated. This method is more advanced compared to the single-level threshold circuit described in the previously mentioned U.S. Pat. No. 4,797,936; however, it is still limited to a very specific way of generating a trigger signal.

U.S. Patent Publication No. 2014/0108856 describes a system operating in real time which relies on a particular sequence of trigger signals. A trigger sequence checker monitors for a predetermined sequence of triggers, and generates an error signal if that sequence is not found. However, this method is more relevant to a multi-channel triggering configuration, and does not solve the problem of waveform-based trigger generation.

The above cited patents and applications describe different solutions for the signal-based triggering problem. However none of those references combine sufficient flexibility and ease of practical implementations for use in applications of the present disclosure. The signal cross-correlation method described in U.S. Pat. No. 4,843,309 is a well known universal signal detection method. However, that approach requires excessive computational complexity and cannot be easily implemented even using most advanced multi-core parallel digital signal processors. Level-crossing hardware based solutions allow real-time implementation, but require dedicated digital and analog circuits. Those methods are not flexible enough for arbitrary signal detection. For example, the number of shift registers and analog comparators is fixed by a triggering circuit design. Also, and even more importantly, none of the above prior art references the address trigger requirements for the precise timing alignment needed for synchronous signal averaging. Also, the issues of time-domain signal-dependent noise analysis based on signal triggering, are not disclosed in the prior art. Precise time-domain synchronous signal averaging, and noise calculation, determine very special requirements for signal trigger and the concept of reference pattern update which will be addressed below in this disclosure.

The main purpose of this disclosure is (i) to describe a method and apparatus for waveform-based triggering, which is at the same time computationally effective and accurate, and (ii) to describe methods of trigger and pattern updates used for synchronous averaging and time domain noise analysis.

SUMMARY

The systems and methods of this disclosure overcome the above-mentioned limitations of the prior art, and provide a universal solution to the waveform triggering problem, having benefits in terms of system resources, computational complexity, accuracy and flexibility.

Waveform triggering is based on an arbitrary reference waveform. The reference waveform can be interactively selected from an input waveform or be a priori available from a library of waveforms of interest.

Waveform trigger detection is based on calculation of stream of error metric values, each value being indicative of a deviation between an input waveform and a reference pattern at a given sampling instant. The error metric of this disclosure is defined as a sum of absolute values of differences between incoming and reference samples. This error metric definition provides significant advantages in terms of required number of calculations without compromising trigger accuracy, and allows effective and efficient hardware implementation.

A waveform trigger signal is generated by finding a time instant corresponding to a minimum value of error metric, with that minimum value being smaller than a preset trigger threshold. This method provides high trigger accuracy, and corresponds to a best match between input and reference waveforms.

The waveform trigger is used for subsequent data processing, performing synchronous averaging of input waveforms, and estimating time domain noise voltage, enabling high resolution signal-dependent noise and jitter measurements.

Further improvement of waveform trigger quality is achieved by reference pattern updates which are based on an averaged signal. These updates enable improved reference waveform estimates in high noise environments and reduce waveform trigger jitter.

An apparatus, implementing the waveform triggering method is described. This apparatus consists of an analog to digital converter, a waveform samples memory, a waveform trigger processor and a waveform processor. The waveform trigger processor performs a calculation of the error metric and a waveform trigger index, subsequent triggering, synchronous averaging, and calculation of time domain noise implemented in the waveform processor.

DETAILED DESCRIPTION

The present disclosure describes a general concept of a signal-based waveform trigger. The waveform used to generate signal trigger is referred to as a "reference signal", or a "reference waveform". This waveform can be arbitrary and is represented by a sequence of N samples $R=[R_1, R_2, \ldots, R_N]$. In most cases of practical interest, these samples are bytes (8-bit numbers). The number of reference waveform samples is arbitrary. The reference waveform can be known in advance, for example, selected from a library of waveforms expected to be found in an incoming signal. Another common method for defining a reference waveform is based on selecting signal of interest interactively from an input waveform S.

An input waveform is represented by a continuous stream of samples $[S=S_1, S_2, \ldots]$. Both the input waveform and the reference waveform are in general contaminated by noise.

Figure 1:
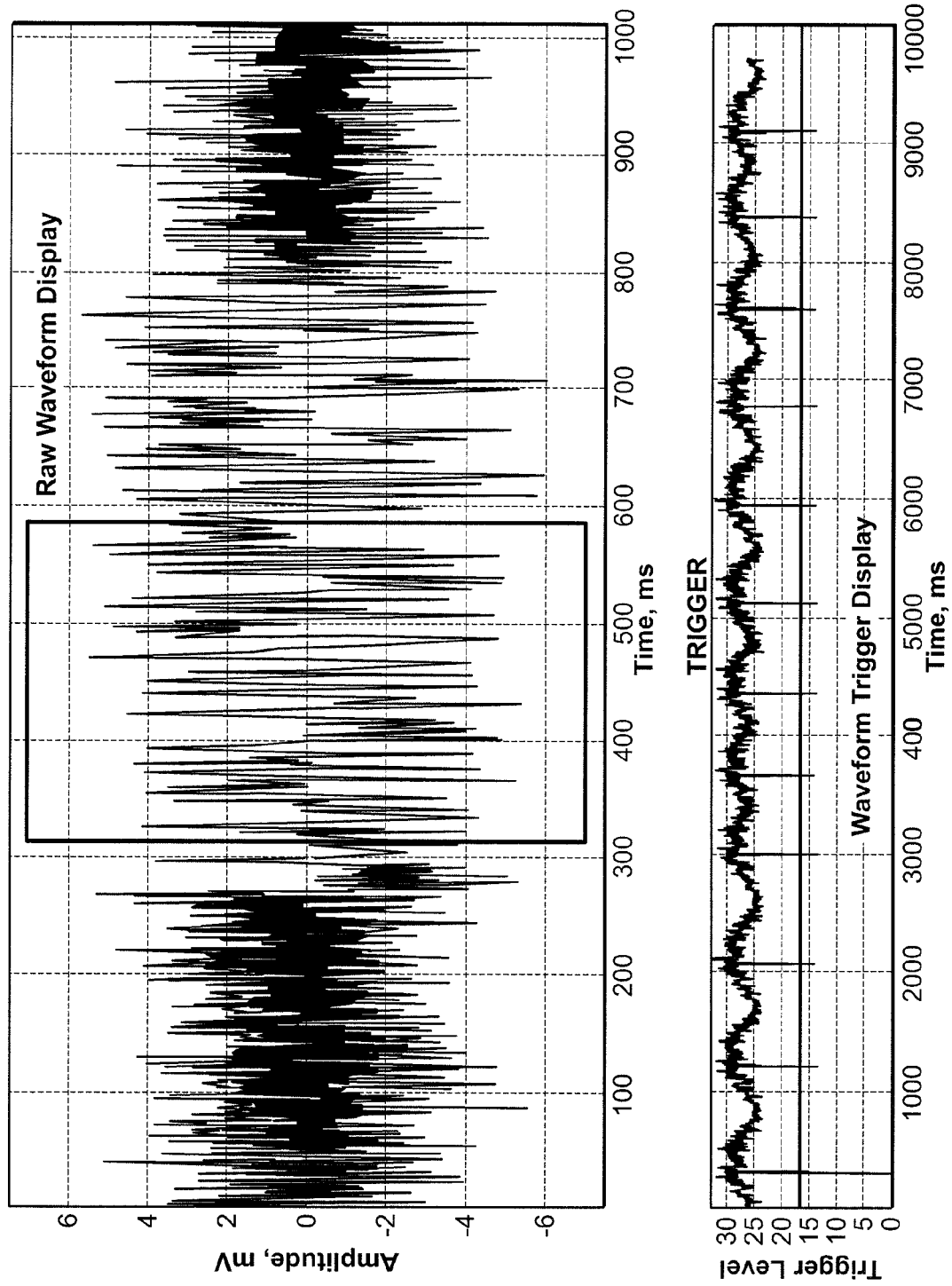
FIG. 1 shows a selection of a reference waveform from a raw input signal trace, and a calculated error metric used for waveform trigger generation.

FIG. 1 depicts an example of interactive reference signal selection using a prototype of a waveform triggering system implemented using a Guzik Technical Enterprises model ADC6000 digitizer system and a digitizer software development kit. The upper display window depicts a noisy waveform generated by a repetition of 127-bit long pseudo-random binary sequence (PRBS). The period of the PRBS is followed by a random noise gap having a random duration. A user-selected reference signal is shown in the marked rectangular area. After this selection is done, samples of the reference waveform are stored and used for subsequent waveform trigger generation. An output of the waveform trigger signal is shown in FIG. 1 in the lower display window, and will be described in details below.

A waveform trigger index represents a memory address (or equivalently a sample number) of an incoming signal which corresponds to a best match between a reference signal R and an input signal S. In order to determine the trigger index, an error metric having a minimum or maximum value for the case of a best signal match, must be defined.

A well-known prior art method for signal matching is based on cross-correlation. A "non-normalized" cross-correlation function is defined as $$C_n = \Sigma_{m=1}^{N} R_m S_{m+n}$$

This equation means that for each sample of an incoming signal, the sum of N products of current and adjacent signal samples with N reference signal samples, is calculated. It is well known that when signal samples coincide with reference samples, a cross-correlation value has a peak. For a noise-free normalized cross-correlation function (divided by standard deviation of signal and reference signals), this peak equals 1, while all other values have smaller values.

A main disadvantage of a cross-correlation method is that it requires N multiplications for each signal sample. For example, using a 20 Gs/s digitizer and selecting a 100 ns segment for a reference waveform, translates to 2000 multiplications per signal sample. This makes real-time, or quasi-real time, trigger generation very challenging even using massive parallelization (e.g, utilizing dedicated CUDA processors).

The concept of cross-correlation originally comes from statistical theory where multiple realizations of random process are analyzed. For deterministic signals, cross-correlation is equivalent to minimum Euclidean distance d2 between a signal and reference samples. Indeed, $$\min d2 = \min \sum_{m=1}^{N} (R_m - S_{m+n})^2 = \min \sum_{m=1}^{N} (R_m^2 + S_{m+n}^2 - 2R_m S_{m+n})$$

Since sums of squared samples of an input waveform and a reference waveform are positive, it can be clearly seen that the squared distance is minimized when the sum of the cross-product $\Sigma_{m=1}^{N} R_m S_{m+n}$ is maximized. Therefore, maximum cross-correlation and minimum squared distance calculations are equivalent.

A squared distance method (also called L2 norm) is not advantageous compared to a cross-correlation method and requires similar amount of calculations. However, significant simplification is achieved if the square operation is replaced by an absolute value as $$\min d1 = \min \sum_{m=1}^{N} |R_m - S_{m+n}|$$

This type of error metric, corresponding to a so-called L1 distance is well known to have very similar properties to a squared distance. The L1 error metric has a computational advantage since operations are limited to byte arithmetic without a need to perform multiplications. It is well known that an implementation of byte digital adders is significantly simpler and faster compared to digital multipliers. Also, a large number of logical cells capable of adding/subtraction is available in general-purpose FPGA chips. Therefore, a preferred embodiment of current disclosure is based on an Error Metric performing a byte-based L1 error metric computation.

The error metric given by L1 norm can also be modified depending on the application. For example, it can be replaced by a weighted version, $$\min d1 = \min \sum_{m=1}^{N} W(R_m) |R_m - S_{m+n}|$$

Here, weighting coefficients $W(R_m)$ are selected to emphasize or de-emphasize certain signal levels. For example, if certain a range of signal samples is more important (e.g., some variation of signal amplitude is to be detected in the range of Level1 to Level2, the values of weighting coefficients in this range are increased, while other signal levels are decreased, so that the weighted difference is still kept within one byte. This method requires an additional multiplication per every incoming sample. However, since the weighting coefficient is fixed, the error metric can be pre-calculated and stored in a look-up table.

Another advantage of the L1 error metric described here, is that by using bit manipulation on input and reference signal waveforms, an error norm calculation is further simplified, and reduced to an arbitrary set of signal threshold comparisons. A full 8-bit number subtraction is represented as comparing each signal sample to 256 levels. Similarly, in the limit case of single threshold, only one bit is analyzed. Indeed, effectively "zero voltage" is represented by an amplitude level equal to a mid-range of a byte sample (127). A signal greater or equal to "zero", always has bit 7 set to 1, while any value smaller than "zero" has this bit set to 0. Thus, a single level threshold comparison is reduced to 1-bit comparison operation, based on bit 7. This operation is equivalent to exclusive OR (XOR) and is well known in prior art. In this case, an error metric calculation is reduced to a Hamming distance equal to the number of bits in the input waveform which are different from the same bits in the reference pattern. A single bit-wise XOR operation is implemented in parallel by FPGA, or any digital processor, in real or near-real time. In a similar fashion, performing a d1 calculation using two signal bits, is equivalent to signal matching using 4 threshold levels (for an 8 byte number, this corresponds to levels <64, between 64 and 128, between 128 and 192 and above 192) etc. Bitwise operations and comparisons are the simplest digital logic functions well known in prior art and are not described in detail here.

A time dependence output of an Error Metric based on L1 norm calculation, is shown in bottom part of FIG. 1. Local minimum values of this metric correspond to a best match between an input waveform and a reference pattern.

Figure 2:
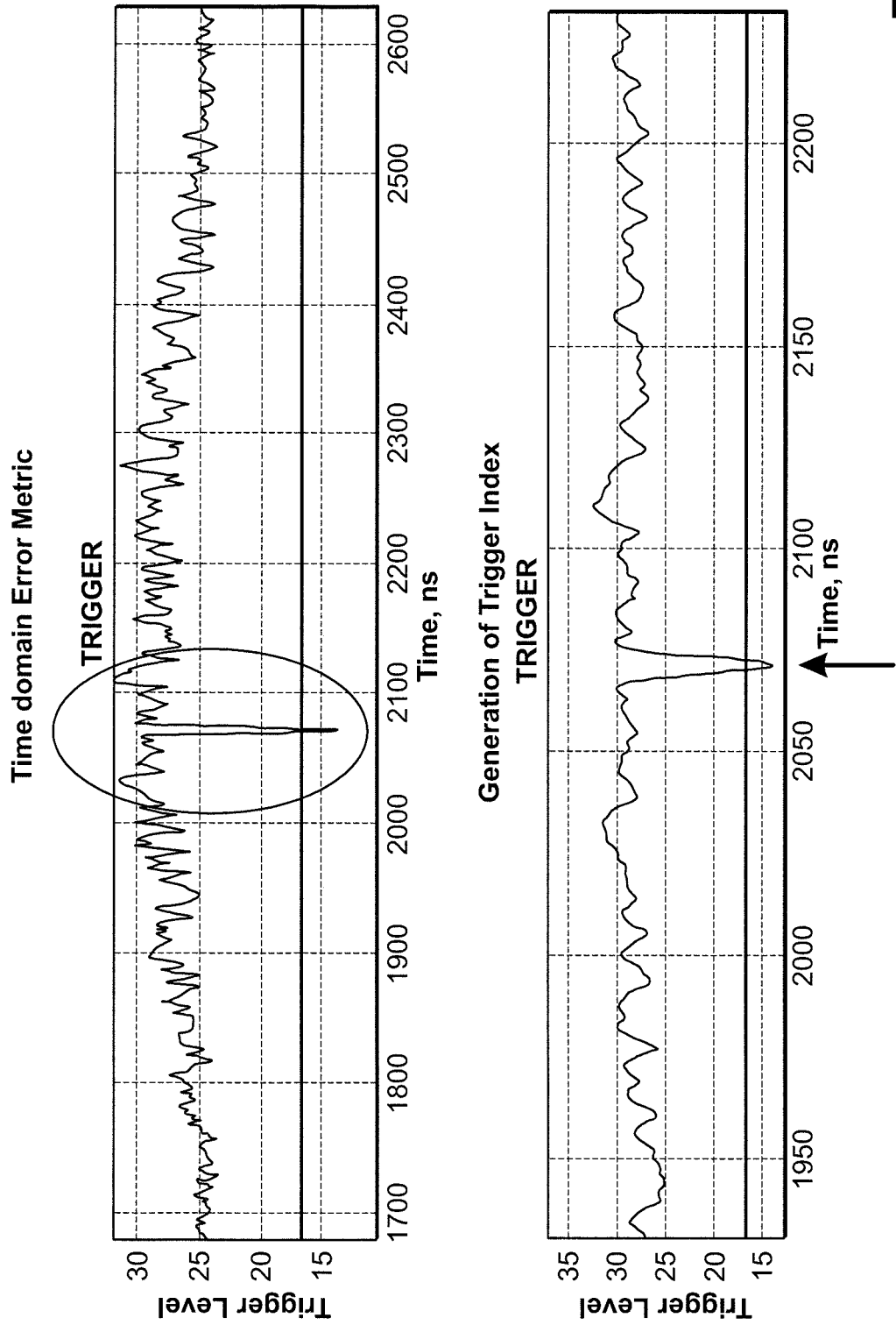
FIG. 2 depicts an exemplary time domain error metric and generated waveform trigger index.

If the coincidence of two waveforms is ideal, the error metric has a well defined minimum equal to zero. In real-life situation when both reference and input waveforms contain noise and jitter, a best value of the error metric is greater than zero. This absolute value strongly depends on the noise level, waveform shape and number of bits used for triggering. FIG. 2 depicts a typical error metric waveform. As seen on the top graph of FIG. 2, the global minimum value is well defined. However, local values of the error metric around the best position, oscillate and have multiple local minimum and maximum values. Therefore, some trigger threshold value is set automatically or interactively in order to reject non-relevant error signal fluctuations. This is done interactively after several periods of acquisitions, in a way similar to a regular trigger adjustment control used in oscilloscopes. In order to set an appropriate level automatically, multiple periods of pattern are acquired and the error metric waveform is analyzed. A mean value of the time-domain error function is calculated and approximate trigger level are set to, for example, 50% between the average and typical global minimum error metric values. This level setting procedure does not require real-time calculation and is done during acquisition setup.

Of course, the described procedure is only an example, and many modifications are possible, e.g., calculating the median value instead of the mean value, finding a minimum value and multiplying it by a certain number, etc.

Once an appropriate trigger level is set, it can be used for an approximate determination of a sample index to be used for subsequent waveform alignment. However, a trigger index based on a threshold value, i.e., an intersection of an error metric signal with the trigger level, is not precise. Noise in the input waveform will modify the value and slope of the error metric signal around the minimum location. As a consequence, the timing index corresponding to level intersection becomes noisy. This timing jitter results in a distortion of the alignment waveform and noise estimate.

In order to eliminate trigger jitter effects, a waveform trigger index is defined by the minimum error metric below the specified trigger level. This procedure is illustrated in the lower graph of FIG. 2, where the "arrow" in FIG. 2 corresponds to the global minimum of the error function falling below the specified trigger threshold. Therefore, the trigger detection level specifies a small range of samples which are located around the "best match" sample index. The index of minimum error metric value corresponds to a global minimum of the error function and, therefore, represents a best match between the reference waveform and the input waveform. If the trigger level is set too high, noisy fluctuations of error metric may result in finding local minima and an incorrect trigger mark detection.

Once the waveform trigger index is detected, synchronous averaging can be activated. Assume that detected waveform trigger indexes are given by $t_1, t_2, \ldots, t_K$. Then, the averaged waveform <S> after K instants of waveform trigger, is given by $$\langle S_n \rangle = \frac{1}{K} \sum_{i=1}^{K} S_{ti+n}$$

Each sample of the averaged waveform of interest is formed as mean of raw input waveform samples relative to the detected waveform trigger index.

Once an average signal estimate is known, time domain noise power samples are calculated as squared sum of differences between raw waveform samples and signal average.

$$N_n^2 = \frac{1}{K} \sum_{i=1}^{K} (S_{ti+n} - \langle S_n \rangle)^2$$

Note that this calculation requires multiplication, however it is performed on already detected signals of interest once the trigger is set and requires a smaller amount of computations. In practical applications, a signal average over K realizations, can be replaced by a "running average" which is a well-known technique for continuous updates of ensemble averages. When a new trigger occurrence is generated, a running average signal and noise power estimates are updated as:

$$\langle S_n^{k+1} \rangle \geq \frac{(K \langle S_n \rangle + S_{ti+n})}{K+1}$$

$$N_n^{k+1^2} = \frac{(K N_n^2 + (S_{ti+n} - \langle S_n^k \rangle)^2)}{K+1}$$

The average waveform of interest after a sufficient number of averages, represents a "noise-free" signal, and is used to perform subsequent measurements. The subsequent measurements are commonly used for signal analysis in oscilloscope and digitizer applications. The noise waveform represents important information about the sources and nature of noise, including additive noise and jitter, including pattern-dependent jitter.

There are multiple noise sources which are caused by various factors. Electronics noise is caused by thermal fluctuations present in any electronic components. For example, Johnson thermal noise is proportional to absolute temperature and resistance. When a signal is transmitted via a communication link, it is subject to different noise sources which are present in the communication channel. When noise is caused by external processes, it is usually independent from the signal. This means that amount of noise found in the waveform is statistically the same for any signal sample and does not change. When the time domain noise power or voltage of this noise source is measured, it should form a uniform, time-independent noise background, meaning that the power of this noise does not vary across the signal.

Other noise sources could be signal-dependent. There are multiple sources of signal and noise dependencies. For example, the amount of noise in a temperature or field sensor may become dependent on signal amplitude or polarity, e.g., a positive signal voltage having a bigger noise compared to that of a negative signal voltage. One of the most important noise sources is related to jitter. For example, if a clock source of the signal generation equipment is not ideally stable, each cycle of frequency is slightly different. In this case, each instantaneous version of the received signal waveform has a slight timing displacement. In many cases, these timing variations depend on the signal shape and frequency response of the communication channel—this type of jitter is usually called "signal-dependent jitter". Analysis and characterization of jitter is very important and is usually done by analyzing the precise timing of particular events (e.g., level crossing) and collecting a histogram of these timing events.

Time-domain noise calculation of this disclosure enables high-resolution measurement of signal-dependent noise as will be illustrated in the following examples.

Figure 3:
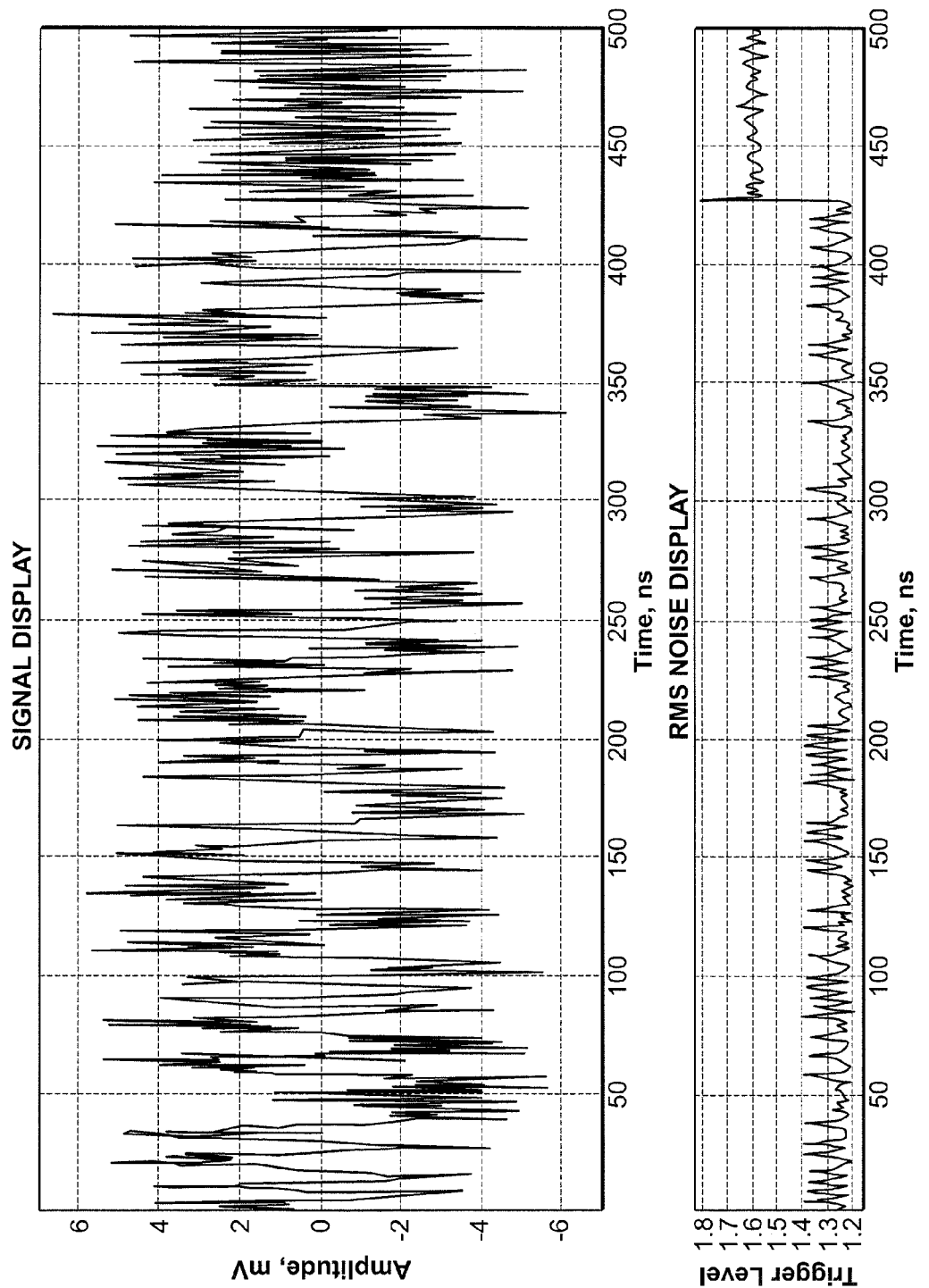
FIG. 3 shows results of synchronous signal averaging based on a waveform trigger and associated time-domain RMS noise.

Average and signal noise estimates are shown in FIG. 3. As seen in the signal display graph, noise in the average signal is significantly reduced Also, a portion of random noise background following the PRBS pattern is averaged out, showing flat near-zero signal. On the noise display window, noise background of approximately 1.2 mV is seen in the pattern region, while the noise region has a stronger noise voltage 1.6 mV. Also, peaks of noise are seen in the signal area. These peaks coincide with PRBS transitions and characterize jitter noise. As seen, the amplitude of the noise voltage is different; some sequences of PRBS transitions result in higher noise peaks which are explained by signal-dependent noise components.

In the general case, some jitter noise signals seen in FIG. 3 can be caused by a significant noise level in the reference waveform which translates into jitter-like displacements of waveform trigger. This trigger noise is reduced using the reference signal and trigger level updates.

When a waveform of interest is selected from a raw signal for subsequent averaging and analysis, it is expected that the raw signal contains noise. In this case, the reference waveform samples are represented by a sum of a "noise-free" value Ro and a noise ni. In this case, a calculation of the error metric based on the noisy reference estimate, results in values which are different from the noise-free case by the value of ni. In other words, a waveform trigger in this case will search for a "noisy" version of reference waveform. Since input waveform also contains noise, a particular combination of the input and reference noise samples may either increase or decrease the error metric and result in erroneous timing shifts.

A way to reduce waveform trigger jitter, is to update the reference waveform to its running average version. This update can be continuous ,or be performed for a preset number of trigger repetitions. It is well known that an average root-mean-squared (rms) voltage of noise is reduced inversely proportional to the square root of the averages. For example, after 100 averages, the average amplitude of noise is reduced 10 times. Usually, this is sufficient for most practical situations having a signal to noise ratio better than 6 dB.

A second effect in this case, is that values of the error metric before and after updates are different. For the initial noisy reference estimate, a minimum value of error corresponding to a best match of the input and reference waveforms is proportional to the sum of the noise samples in the input and reference waveforms. For a squared metric, this value is twice the noise power. For an absolute difference metric, it is smaller and close to 1.5 of the average rms noise. However, after the pattern update, noise is present only in the input waveform, and the time-domain error signal is "pulled" to smaller values (approximately by 25-30%). For signals with a reasonably high SNR, this effect is small. However, it becomes more significant for a high noise environment. A simple solution for a trigger level update is to monitor the average detected error metric minimum value. When this value is reduced, the trigger level is reduced by the same value. For example, if an initial average value of the error metric minimum for first 10 trigger events, was 50 and the trigger was set to 100, after pattern updates, the error minimum moved to 25 and trigger level is reduced by 25 units, becoming 75.

Figure 4:
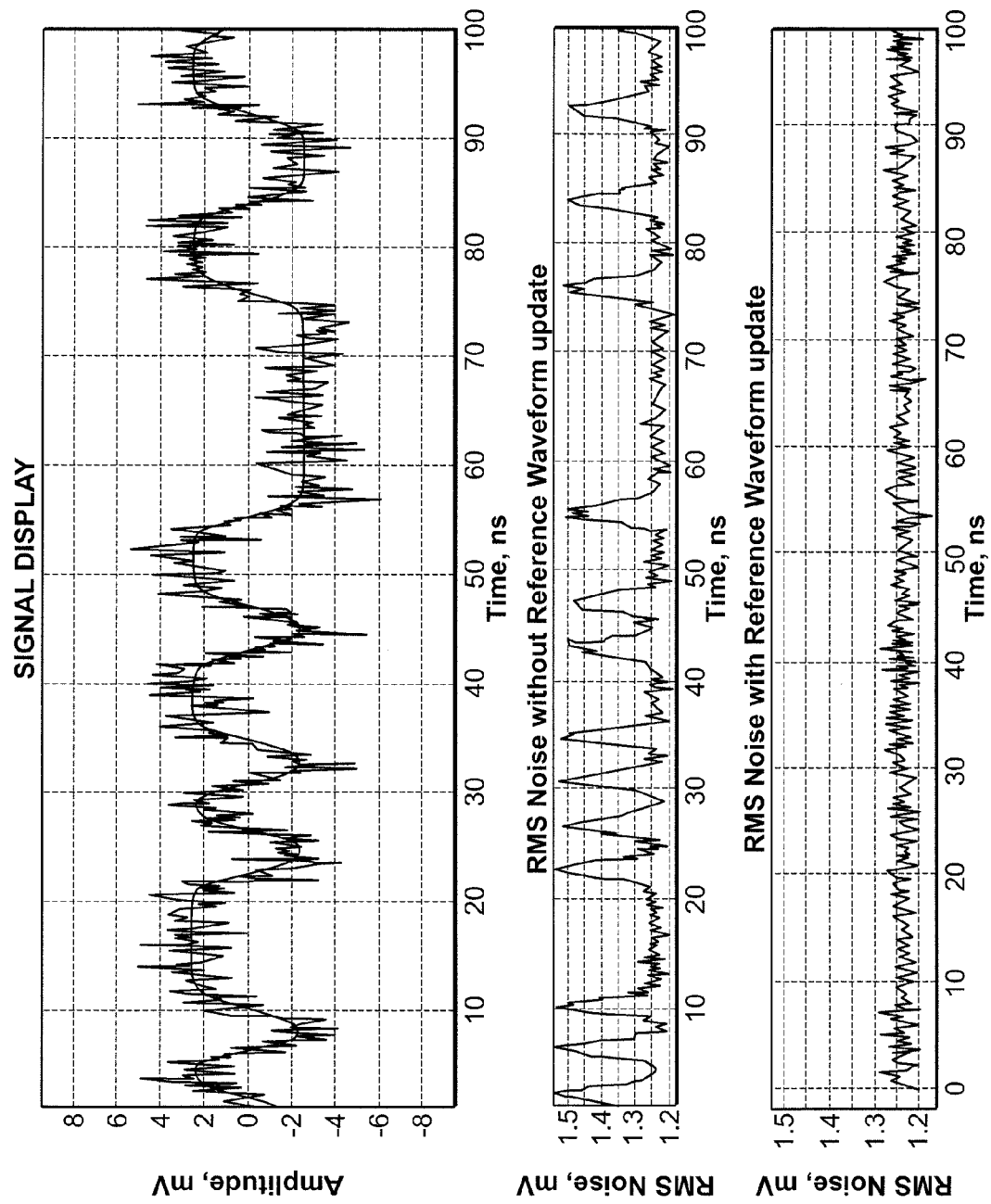
FIG. 4 shows exemplary effects of reference waveform updates on estimated time domain RMS noise in poor SNR conditions.

FIG. 4 illustrates the effects of a reference waveform update on a jitter-free PRBS signal acquisition in a poor SNR case. The top screen of FIG. 4 displays the raw instantaneous waveform and average signal obtained by waveform triggering. The second plot of FIG. 4 shows the RMS noise obtained after a 10K signal averages with a noisy reference waveform. As seen, the noise floor is around 1.25 mV. However, 1.55 mV peaks of RMS noise are clearly observed for every transition in the signal. These peaks do not correspond to input waveform jitter but are introduced by waveform trigger jitter. The bottom plot of FIG. 4 displays the RMS noise obtained with the described updates of the reference signal. As seen, jitter is eliminated and the noise floor is flat at 1.25 mV across the signal.

Figure 5:
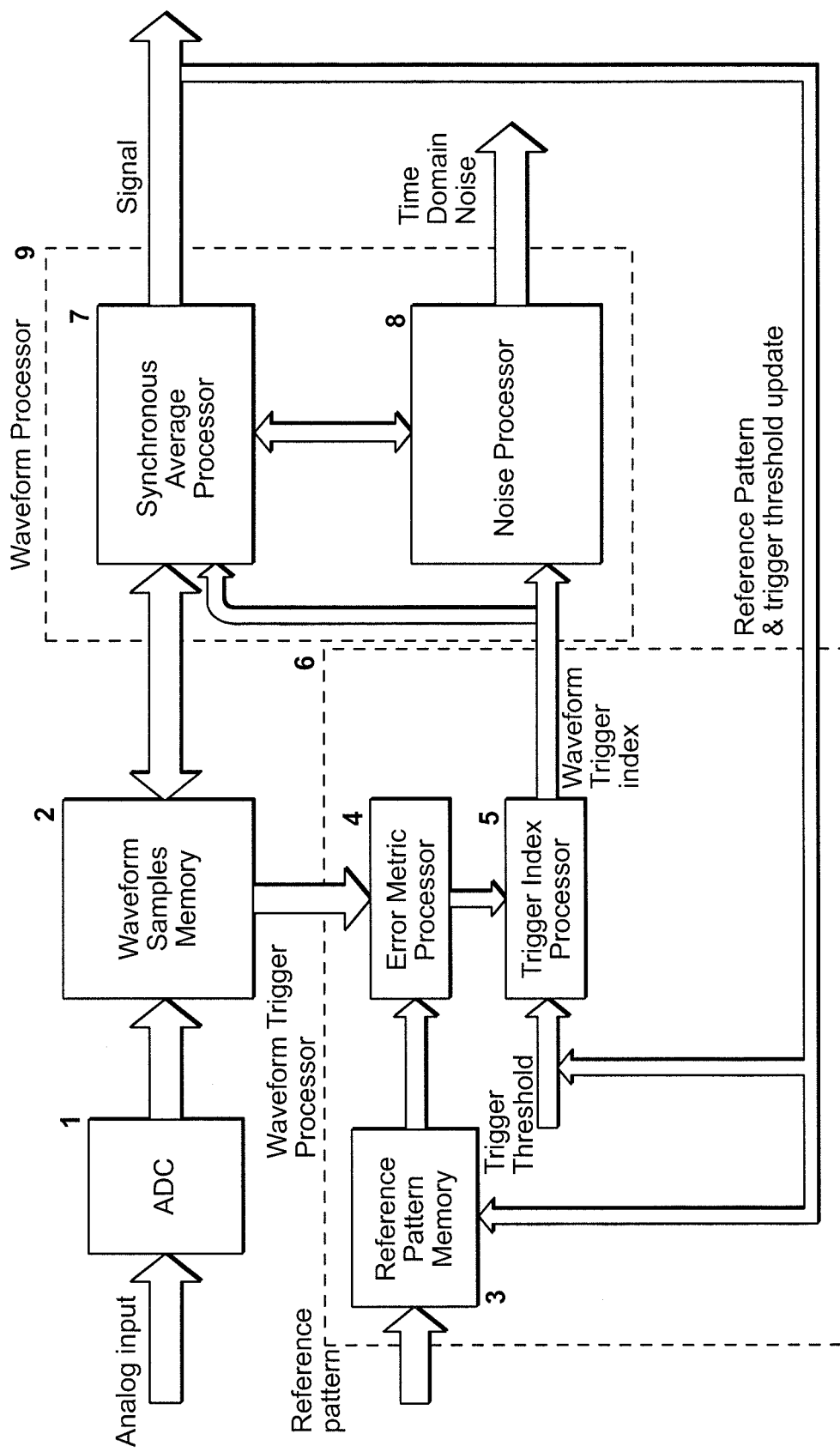
FIG. 5 shows in block diagram form, an exemplary digital signal acquisition system with waveform trigger processor and waveform processor.

The method for waveform triggering described above is implemented in an exemplary apparatus depicted in FIG. 5. An analog to digital converter 1 converts an input analog signal into a stream of digital samples. Those samples are stored in a waveform memory 2 which is accessible by a waveform trigger processor 6 and waveform processor 9.

Waveform trigger processor 6 includes a dedicated reference pattern memory 3, which stores samples of the reference pattern. This reference pattern is selected from the input waveform, or, alternatively, loaded from an external "signal library" keeping digital signals of interest. The length of the reference pattern is programmable and depends on type of input signals and digitizer sampling rate. In general case there is no limitation on reference pattern length. However, longer reference signals require a larger number of computations for generation of a waveform trigger.

The error metric processor 4 reads data from reference pattern memory 3 and waveform samples memory 2, and calculates error metric values for each sample of the incoming signal. A preferred embodiment of this disclosure is based on L1 error metric which allows effective hardware implementation, for example, in a dedicated FPGA or digital processor.

Figure 6:
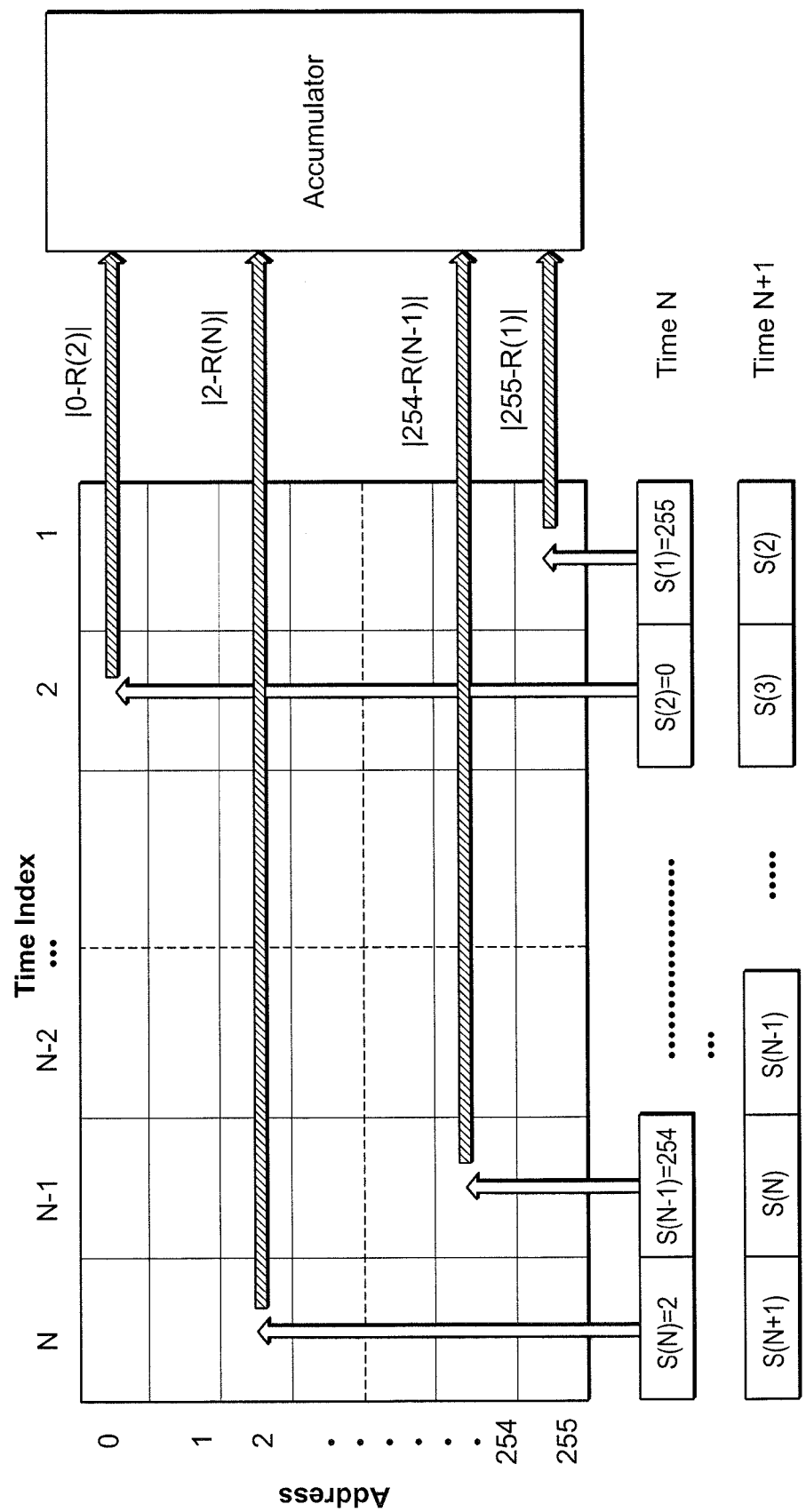
FIG. 6 shows an exemplary look-up table method for error metric calculation during signal acquisition.

Depending on particular acquisition system architecture, it may be advantageous to consider a look-up table (LUT) implementation the error metric generation since the sequence of reference samples is fixed and each element of the error metric sum is represented by 8 bits. Therefore, the LUT contains 256*N bytes of memory entries. For N-1000, this LUT occupies only 256K of memory. Each element of the table LUT(i,j) has two indices: i having values from 0 to 255 and j having values from 1 to N. Each element of the table is set to be equal to an absolute value of |R(j)−i| determined during table generation. Once LUT values are calculated, memory locations are scanned and the error metric is generated by adding sequences of table values {LUT(S[1],1), LUT(S[2],2), LUT[S[N],N)}. This is illustrated in FIG. 6 where sequence of incoming samples is continuously updated by keeping N current values. Each byte value of raw waveform determines the index i, while the memory value corresponds to a difference of the reference signal from the incoming sample. Note that different realizations of the LUT architecture are possible. For example, a 2-dimensional table can be split into N one-dimensional tables. Also, the table need not be scanned sequentially from first to last sample, meaning that different memory locations can be read in parallel to achieve a higher processing rate.

When the value of calculated the error metric becomes smaller than a preset trigger threshold, a Trigger Index Processor 5 starts analyzing the error metric values, selecting for the minimum value of this metric. The trigger threshold is set based on the input signal, reference signal, sampling rate and analog input signal to noise ratio, in the manner similar to trigger setting in a digital oscilloscope.

Once the negative slope trigger threshold crossing (i.e. output of Error Metric Processor 4 changes from values larger than threshold level to smaller than threshold), operation of trigger index processor 5 is activated and continues until a "positive" threshold crossing is detected. The sample index corresponding to the minimum value of the error metric within this interval, corresponds to the waveform trigger index.

Once the waveform trigger index is generated by Trigger Index Processor 5, the waveform samples from waveform sample memory 2 are further processed and analyzed by Waveform Processor 9. In the simplest mode, the waveform trigger index is used for real-time or near-real time waveform display, synchronized with the occurrence of the reference pattern in the input waveform. Also, segments of the input waveform are sent to external storage device for subsequent analysis.

Waveform Processor 9 consists of two signal processor modules—Synchronous average processor 7 and Noise processor 8.

Synchronous average processor 7 calculates a running average of the input waveform samples, which is synchronized to the waveform trigger index.

Noise processor 8 accepts the waveform trigger index and running average waveform from the output of synchronous average processor 7, and calculates a running estimate of time-domain noise. Time domain noise is given by calculating a squared difference between waveform samples and an available running average estimate generated by synchronous average processor 7.

Once the running signal average estimate is available at the output of synchronous average processor 7, it is used for a reference pattern update by re-writing the reference pattern already stored in reference pattern memory 3. This update is enabled in cases when the reference pattern is selected from a noisy analog input signal in a poor SNR environment. When the reference pattern is updated, it also requires an update of the trigger threshold. These updates of the reference pattern and the trigger threshold reduce noise in the detected waveform trigger and eliminate undesirable jitter in the detected time domain noise.

Waveform processor 9, including synchronous average processor 7 and noise processor 8, are implemented using dedicated FPGA, or signal processing hardware, for example multi-processor graphic cards.

Those skilled in the art will recognize that a number of changes may be made to the details of the above described preferred embodiments. For example, several different waveforms may be detected by different waveform triggers. Error metric calculation can be modified by introducing weighting to emphasize or de-emphasize specific ranges of signal amplitudes or time changes. Calculation of the error metric can be performed using FPGA or dedicated signal processing or by using dedicated or general-purpose parallel devices, such as for example NVIDIA CUDA processors. Also, the particular details of the trigger level and reference signal selection may vary. Running average signal and noise updates may be performed based on waveforms stored in an acquisition memory only for given number of trigger detections. The same method can be used for off-line processing of streamed waveform recordings, so analysis may or may not be performed in real time.

The scope of the present invention is determined by the following claims.

What is claimed is:

1. A method of data acquisition with waveform triggering, comprising the steps of:
   A. defining a reference waveform pattern for waveform triggering, and digitizing the reference waveform pattern to generate for a succession of reference sample times, a corresponding sequence of digitized reference pattern samples;
   B. digitizing an input waveform to generate for a succession of input sample times corresponding to the respective reference sample times, a sequence of digitized input waveform samples, and calculating a stream of error metric values based on a detected deviations of the input pattern samples from respective reference waveform samples;
   C. comparing respective error metric values with a predetermined trigger threshold and determining a sample index, wherein the sample index is representative of a minimum error metric value below the trigger threshold; and
   D. using the determined sample index as a waveform trigger index for triggering sampling of input waveforms.

2. A method for data acquisition of claim 1, wherein said error metric is based on a sum of absolute differences between the input waveform samples and the corresponding reference pattern samples.

3. A method for data acquisition of claim 1 further including the step of calculating an average input signal waveform by a summation of the input waveform samples synchronized with the determined waveform trigger.

4. A method for data acquisition of claim 2, wherein a number and a position of respective bits used for the error metric calculation is programmable.

5. A digital waveform acquisition method of claim 2, wherein error metric values are modified by weighting coefficients, wherein the number and values of the coefficients weighting coefficients is programmable.

6. A digital waveform acquisition method of claim 2, wherein error metric calculation is implemented using a look-up table.

7. A method for data acquisition of claim 3, further including step of calculating a time domain noise power signal by a summation of a squared difference between the respective input waveform samples and a calculated average signal waveform.

8. A method for data acquisition of claim 3, further including a step of updating a sequence of reference pattern waveform samples based on a calculated average signal waveform.

9. A method for data acquisition of claim 8, further including step of updating the trigger threshold based on a calculated average signal waveform.

10. A method for data acquisition of claim 2 further including the step of calculating an average input signal waveform by a summation of input waveform samples synchronized with the determined waveform trigger.

11. A method for data acquisition of claim 10, further including the step of calculating a time domain noise power signal by a summation of a squared difference between the respective input waveform samples and a calculated average signal waveform.

12. A method for data acquisition of claim 10, further including the step of updating sequence of reference pattern samples based on a calculated average signal waveform.

13. A method for data acquisition of claim 12, further including step of updating the trigger threshold based on a calculated average signal waveform.

14. A digital waveform acquisition apparatus comprising:
   A. a waveform digitizer for generating stream of input waveform samples for an input waveform applied to an analog input, wherein the input waveform samples correspond to the respective values of the input waveform at a succession of input sample times; and transferring these input waveform samples to a waveform samples memory; and
   B. a waveform trigger processor comprising:
      i. a reference pattern memory containing reference pattern samples of a reference waveform pattern determined for a succession of reference sample times corresponding to the succession of input sample times;
      ii. an error metric processor responsive to the input waveform samples and the reference pattern samples to generate a corresponding stream of error metric values; and
      iii. a trigger index processor responsive to the stream of error metric values to compare the respective error metric values of the error metric values stream to a programmable threshold level and determining an error function index for an error metric value below said threshold level, to be a waveform trigger index.

15. A digital waveform acquisition apparatus according to claim 14, wherein an error metric calculation is based on a sum of absolute values of differences between the reference waveform samples and corresponding input waveform samples.

16. A digital waveform acquisition apparatus according to claim 14, wherein waveform trigger processor is implemented in FPGA.

17. A digital waveform acquisition apparatus of claim 14, wherein number and position of bits used for the error metric calculation is programmable.

18. A digital waveform acquisition apparatus of claim 14, wherein the error metric values are modified by weighting coefficients, wherein the number and values of the weighting coefficients are programmable.

19. A digital waveform acquisition apparatus of claim 14, wherein the error metric calculation is implemented using a memory look-up table.

20. A digital waveform acquisition apparatus of claim 14, further comprising a waveform processor having a synchronous average processor for synchronous averaging of said synchronized waveforms using the waveform trigger index from the waveform trigger processor.

21. A digital waveform acquisition apparatus of claim 20, further comprising a noise processor as part of the waveform processor, receiving the waveform trigger index from the waveform trigger processor and adapted for calculating time domain noise power using squared difference between the input waveform samples and the average waveform samples.

22. A digital waveform acquisition apparatus of claim 20, further comprising means for reference pattern memory updates and trigger threshold updates based on the output of synchronous average processor.

23. A digital waveform acquisition apparatus using waveform trigger according to claim 14, wherein error metric calculation is based on sum of absolute values of differences between reference waveform and input waveform samples.

24. A digital waveform acquisition system of claim 14, wherein number and position of bits used for error metric calculation is programmable.

25. A digital waveform acquisition apparatus of claim 14, wherein error metric values are modified by weighting coefficients, number and values of these coefficients being programmable.

26. A digital waveform acquisition apparatus of claim 14, wherein error metric calculation is implemented using look-up table.

27. A digital waveform acquisition apparatus using waveform trigger according to claim 14, wherein error metric calculation is based on sum of absolute values of differences between reference waveform and input waveform samples.

28. A digital waveform acquisition apparatus of claim 27, wherein number and position of bits used for error metric calculation is programmable.

29. A digital waveform acquisition apparatus of claim 27, wherein error metric values are modified by weighting coefficients, number and values of these coefficients being programmable.

30. A digital waveform acquisition apparatus of claim 27, wherein error metric calculation is implemented using look-up table.

31. A digital waveform acquisition apparatus of claim 27, further comprising Waveform processor, having synchronous average processor for synchronous averaging of said synchronized waveforms.

32. A digital waveform acquisition apparatus of claim 31, further comprising Noise processor as part of Waveform processor, including means for calculating time domain noise power using squared difference between input waveform samples and average waveform samples.

33. A digital waveform acquisition apparatus of claim 27, further comprising means for reference pattern memory updates and trigger threshold updates based on the output of synchronous average processor.

* * * * *